(12) United States Patent
Stone et al.

(10) Patent No.: US 10,026,590 B2
(45) Date of Patent: Jul. 17, 2018

(54) FIDUCIAL DESIGN FOR TILTED OR GLANCING MILL OPERATIONS WITH A CHARGED PARTICLE BEAM

(71) Applicant: FEI Company, Hillsboro, OR (US)

(72) Inventors: Stacey Stone, Brno (CZ); Sang Hoon Lee, Forest Grive, OR (US); Jeffrey Blackwood, Portland, OR (US); Michael Schmidt, Gresham, OR (US); Hyun Hwa Kim, Seoul (KP)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/758,466

(22) PCT Filed: Dec. 30, 2013

(86) PCT No.: PCT/US2013/078315
§ 371 (c)(1),
(2) Date: Jun. 29, 2015

(87) PCT Pub. No.: WO2014/106182
PCT Pub. Date: Jul. 3, 2014

(65) Prior Publication Data
US 2015/0357159 A1 Dec. 10, 2015

Related U.S. Application Data

(60) Provisional application No. 61/747,515, filed on Dec. 31, 2012, provisional application No. 61/747,516, filed on Dec. 31, 2012.

(51) Int. Cl.
*H01J 37/317* (2006.01)
*H01J 37/305* (2006.01)

(52) U.S. Cl.
CPC ........ *H01J 37/317* (2013.01); *H01J 37/3056* (2013.01); *H01J 2237/221* (2013.01);
(Continued)

(58) Field of Classification Search
CPC ............... H01J 37/3056; H01J 37/317; H01J 2237/221; H01J 2237/226; H01J 2237/2814; H01J 2237/31745
(Continued)

(56) References Cited

U.S. PATENT DOCUMENTS 3,699,334 A * 10/1972 Cohen ................... H01J 37/304
204/192.34
5,435,850 A 7/1995 Rasmussen
(Continued)

FOREIGN PATENT DOCUMENTS

JP 2007164992 A 6/2007
JP 2009139132 A 6/2009
(Continued)

OTHER PUBLICATIONS

Beckschafer "Tomographic Orientation Microscopy (3D EBSD) Using a Join FIB SEM Technique", Max-Planck-Institut Beckschaefer fuer Esenforschung GmbH, Sep. 2009, pp. 1-12.*
(Continued)

*Primary Examiner* — Rodney G McDonald
(74) *Attorney, Agent, or Firm* — Scheinberg & Associates, P.C.; Michael O. Scheinberg; John B. Kelly (57) ABSTRACT

A method for analyzing a sample with a charged particle beam including directing the beam toward the sample surface; milling the surface to expose a second surface in the sample in which the end of the second surface distal to ion source is milled to a greater depth relative to a reference depth than the end of the first surface proximal to ion source; directing the charged particle beam toward the second surface to form one or more images of the second surface; forming images of the cross sections of the multiple adjacent features of interest by detecting the interaction of the electron beam with the second surface; assembling the images of
(Continued)

the cross section into a three-dimensional model of one or more of the features of interest. A method for forming an improved fiducial and determining the depth of an exposed feature in a nanoscale three-dimensional structure is presented.

8 Claims, 11 Drawing Sheets

(52) U.S. Cl.
CPC . *H01J 2237/226* (2013.01); *H01J 2237/2814* (2013.01); *H01J 2237/31745* (2013.01)

(58) Field of Classification Search
USPC .................................................. 204/192.34
See application file for complete search history.

(56) References Cited

U.S. PATENT DOCUMENTS

| | | | |
|---|---|---|---|
| 5,851,413 | A | 12/1998 | Casella et al. |
| 7,161,159 | B2 | 1/2007 | Hill et al. |
| 8,502,172 | B1 | 8/2013 | Bugge et al. |
| 2006/0113496 | A1 | 6/2006 | Yoshioka |
| 2008/0290291 | A1 | 11/2008 | Kaga |
| 2008/0315088 | A1 | 12/2008 | Takahashi et al. |
| 2010/0288925 | A1 | 11/2010 | Principe |
| 2012/0067718 | A1* | 3/2012 | Cox ................ G01N 1/286 |
| | | | 204/192.33 |
| 2012/0205538 | A1 | 8/2012 | Schertel |
| 2012/0286159 | A1 | 11/2012 | Dietmar |
| 2013/0186747 | A1 | 7/2013 | Schmidt et al. |

FOREIGN PATENT DOCUMENTS

| | | |
|---|---|---|
| JP | 2012146659 A | 8/2012 |
| WO | 2013039891 | 5/2013 |
| WO | 2014055982 A1 | 4/2014 |

OTHER PUBLICATIONS

W. Hauffe et al., "Using the Ion Beam Slope Cutting Technique for the Examination of the Microstructure of Composite Ceramics with Extremely Different Components (BN/TiB2) in the Scanning Electron Microscope," Praktische Metallographie, Hanser, Muenchen, DE, vol. 41, No. 7, Jul. 1, 2014, pp. 343-353.

* cited by examiner

FIDUCIAL DESIGN FOR TILTED OR GLANCING MILL OPERATIONS WITH A CHARGED PARTICLE BEAM

TECHNICAL FIELD OF THE INVENTION

The present invention relates to charged particle beam milling and, in particular, to a method of forming a planar cross section view for a scanning electron microscope.

BACKGROUND OF THE INVENTION

Charged particle beam systems are used in a variety of applications, including the manufacturing, repair, and inspection of micro-fabricated devices, such as integrated circuits, magnetic recording heads, and photolithography masks. Dual beam systems, such as the DualBeam instruments commercially available from FEI Company, the assignee of the present invention, typically include a scanning electron microscope (SEM) that can provide a high-resolution image with minimal damage to the target, and an ion beam system, such as a focused or shaped beam system (FIB), that can be used to alter substrates and to form images. Such dual beams systems are described, for example, in U.S. Pat. No. 7,161,159 to Hill et al., which is incorporated by reference in its entirety in the present application. In some dual beam systems, the FIB is oriented an angle, such as 52 degrees, from the vertical and an electron beam column is oriented vertically. In other systems, the electron beam column is tilted and the FIB is oriented vertically or also tilted. The stage on which the sample is mounted can typically be tilted, in some systems up to about 60 degrees.

A common application for a dual beam system is analyzing defects and other failures during micro-fabrication to troubleshoot, adjust, and improve micro-fabrication processes. Defect analysis is useful in all aspects of semiconductor production including design verification diagnostics, production diagnostics, as well as other aspects of microcircuit research and development. As device geometries continue to shrink and new materials are introduced, the structural complexity of today's semiconductors grows exponentially. Many of the structures created with these new materials are re-entrant, penetrating back through previous layers. Thus, the defects and structural causes of device failure are often hidden well below the surface.

"Deprocessing" means removing structure to expose underlying structure. Deprocessing is sometime necessary to characterize buried structures. Current deprocessing techniques concentrate on delivering data and access to the structure in a planar fashion—mills are crafted to create surface orthogonal to the device surfaces in order to allow imaging, probing, or other localization techniques. Likewise cleaving the wafer or parallel-lapping deprocessing produces a plane of information/access to the structure. Current imaging and fault isolation techniques (microprobing, scanning—capacitance microscopy, voltage-contrast imaging) access this planar surface to provide either structural/metrological data, or electrical information for further isolating the fault.

Accordingly, defect analysis often requires cross-sectioning and viewing defects on a three-dimensional basis. Better systems capable of performing three dimensional defect analyses are more important than ever. This is because there are more defects that are buried and/or smaller, and in addition, chemical analysis is needed in many cases. Moreover, structural diagnostics solutions for defect characterization and failure analysis need to deliver more reliable results in less time, allowing designers and manufacturers to confidently analyze complex structural failures, understand the material composition, and source of defects, and increase yields.

Additionally, while most regions of interest in prior art integrated circuits are confined to a small volume of the integrated circuit (IC) device in a normally planar region (i.e. a SRAM or NAND flash cell occupies a distinct X and Y location, with a small volume of active are in the Z direction), evolving new technologies require more distinct isolation of the volume-of-interest (VOI) in three dimensions. Identification of a current technology region of interest (ROI) typically involves either a X/Y bit address, a gate X/Y address on the die, or some other essentially X/Y localization data because the active area is confined to the substrate wafer surface. Emerging 3D IC fabrication technologies do not constrain the active area to one plane in the Z direction. Active areas have many levels of active devices. X, Y, and Z coordinate information is necessary.

Figure 1:
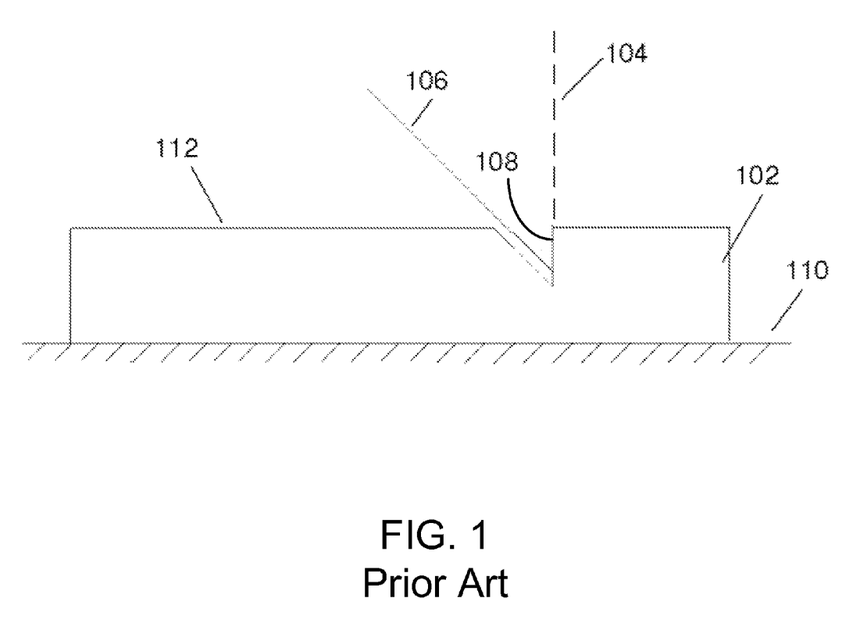
FIG. 1 shows a method for exposing a cross-section using a dual beam SEM/FIB system as known in the prior art.

FIG. 1 shows a method for exposing a cross-section using a dual beam SEM/FIB system as known in the prior art. Typically, to analyze a feature within the sample 102, a focused ion beam (FIB) exposes a cross section, or face 108, perpendicular to the top of the surface 112 of the sample material having the hidden feature to be viewed. Because the SEM beam axis 106 is typically at an acute angle relative to the FIB beam axis 104, a portion of the sample in front of the face is preferably removed so that the SEM beam can have access to image the face. One problem with the prior art method is that a large number of cross-sections must typically be exposed along the length of the trench to form a set of samples of a sufficient size to properly characterize the trench.

For features that are deep relative to the opening that is being made by the FIB, the prior art method suffers from a reduced signal to noise ratio. The situation is analogous to shining a flashlight into a deep hole to try to form an image of the side of the hole. For example, a typical copper interconnect trench is 5-8 nanometers (nm) wide by 120 nanometers deep. Many of the electrons from the SEM remain in the trench and are not scattered back to the detector.

Another drawback, for example in defect analysis applications, is that many cross sections have to be taken along the length of the feature to find a defect. This can be a time consuming process. If the defect lies in between cross sections, then the defect may be missed, or more cross sections have to be taken, increasing the length of time of the verification process.

When an ion beam is used to expose a portion of a 3D IC or three dimensional nanoscale structure for analysis, it can be essential to determine precisely not only the X-Y coordinate of the feature of interest, but also Z coordinate, that is, the depth of the feature below the work piece surface. Prior art techniques are not sufficiently accurate for processing features on the nanoscale.

Fiducials are often used to locate a feature of interest on a sample workpiece. Fiducials made on the sample with the FIB at one orientation do not provide optimal features for imaging and subsequent FIB milling references when viewed at another tilted orientation.

SUMMARY OF THE INVENTION

An embodiment of the present invention is directed to a method and system for analyzing a sample with a charged particle beam. Embodiments of the method include directing a charged particle beam toward a surface of a sample; milling the surface to expose a second surface in the sample in which the end of the second surface distal to ion source is milled to a greater depth relative to a reference depth than the end of the first surface proximal to ion source; directing the charged particle beam toward the second surface to form one or more images of the second surface; forming images of the cross sections of the multiple adjacent features of interest by detecting the interaction of the electron beam with the second surface; and assembling the images of the cross section into a three-dimensional model of one or more of the features of interest.

Another embodiment of the present invention is directed to a method and system for forming a fiducial on a sample. Embodiments of the method include positioning a sample so that a charged particle beam is directed at the sample for a first milling operation, the charged particle beam being directed at a first angle that is substantially orthogonal to a second angle; directing a charged particle beam at the sample to mill a face on the sample that is substantially parallel to the charged particle beam; milling a face on the sample that is substantially parallel to the charged particle beam; forming a fiducial on the milled face of the sample; and positioning the sample so that the charged particle beam is directed at the sample for a second milling operation, the charged particle beam being directed at the second angle, the second angle being no greater than ten degrees with respect to the sample surface.

In another embodiment, the depth of an exposed feature in a nanoscale three-dimensional structure is determined using the angle of the cut exposing the feature and the distance of the horizontal feature from the edge of the cut or from a reference mark Embodiments of the present invention also include system for performing the above-mentioned methods. The systems include a focused ion beam system, an scanning electron microscope, and a sample stage.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

U.S. patent application Ser. No. 13/609,811, entitled "Glancing Angle Mill", which is herein incorporated by reference in its entirety, discloses a sample analysis method that, rather than using an orthogonally oriented FIB to expose a sequence of cross-sections, makes use of a glancing angle milling technique in which the FIB is oriented at a very small angle to the sample surface, preferably at an angle no greater than 10°. Because the ion beam is oriented at such a small angle relative to the sample surface, the amount of sample material milled away will be greater opposite the ion source. That is, the exposed surface is milled to a greater depth on the end of the sample that is farthest from the ion source than the end that is closest to the ion source. This causes the exposed surface to have a downward slope relative to the original sample surface. Once the sloped sample surface has been exposed, the exposed face can then be imaged from the top down, for example with an electron beam. The image of the exposed sloped face will essentially be a combination of a planar view and multiple cross section views in terms of the structural information provided.

Figure 2:
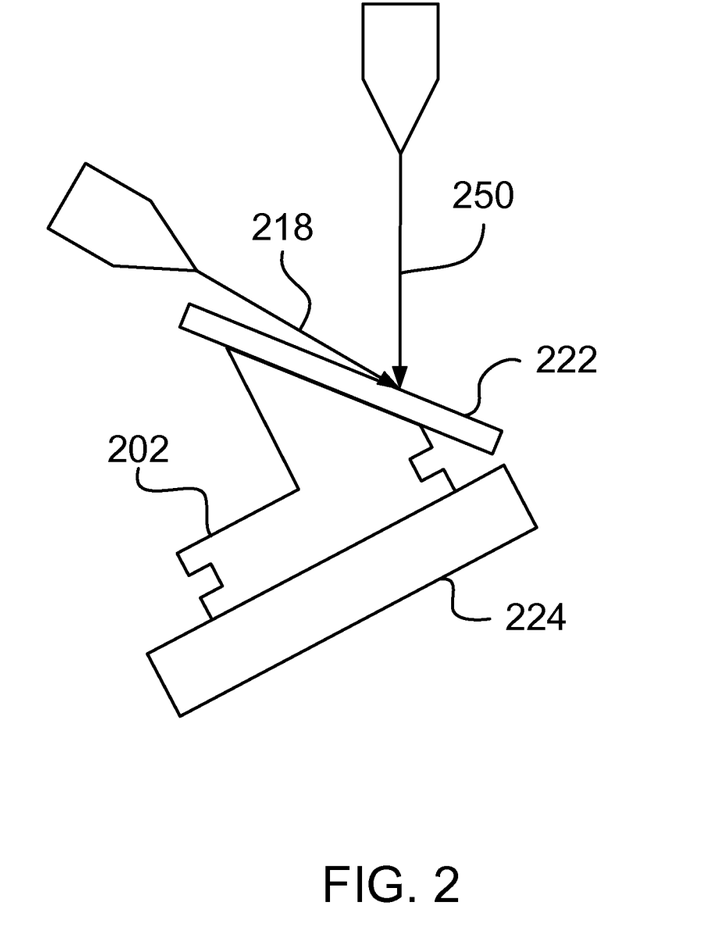
FIG. 2 shows an ion beam milling the top surface of sample 222 at a glancing angle.

FIG. 2 shows an ion beam milling the top surface of sample 222 at a glancing angle. In the embodiment of FIG. 2, sample 222 is mounted on a standard 45° pre-tilted sample stub 202, which is in turn mounted on a tilting sample stage 224 in an ion beam system such as a dual beam SEM/FIB. The electron beam and the ion beam are oriented with the electron beam 250 normal to an untilted sample stage and the ion beam 218 at an angle of approximately 52°. In other embodiments, pre-tiled sample stub 202 is not used and the tilt of the sample is set by sample stage tilt and/or column tilt.

In accordance with embodiments of the present invention, the glancing angle milling technique is used to form successive planar cross section views of features of interest at increasing depths. The successive planar cross section views are then reconstructed to form a three dimensional model ("3D") of the features of interest in the direction of increasing depth. Embodiments of the present invention are particularly well-suited for forming successive planar cross section views of multiple adjacent features that are substantially identical, such as through-silicon vias (TSV). A glancing angle mill removes material to a greater depth the farther the material is from the beam source. For multiple adjacent features that are substantially identical, the feature farthest from the beam source is milled to a greater depth than features that are closer to the beam source. The angle of the glancing angle mill can be chosen such that the sections formed on each of the multiple adjacent features can be reconstructed to form a three dimensional model of one feature of interest. That is, the 3D model can be made with one milling operation, instead of multiple milling operations forming successively deeper cross sections of one feature of interest and reconstructing them into a 3D model, substantially reducing processing time.

Figure 3:
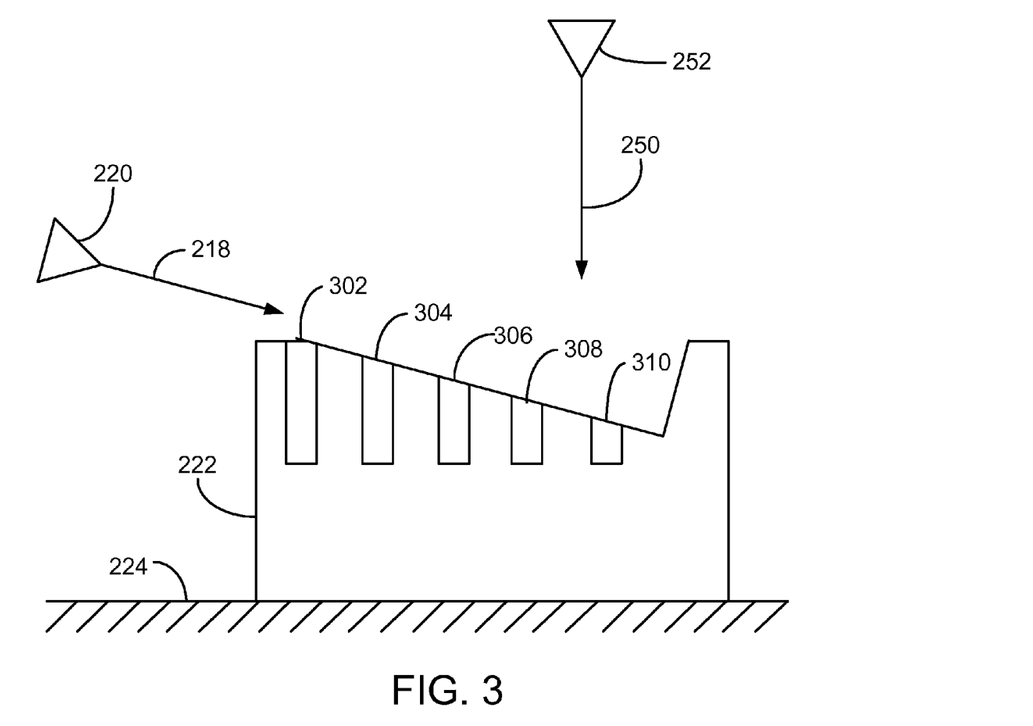
FIG. 3 shows a side view of a sample workpiece after performing a glancing angle milling operation with multiple adjacent features that are substantially identical.

FIG. 3 shows a side view of sample workpiece 222 after performing a glancing angle milling operation with multiple adjacent features 302-310 that are substantially identical. Focused ion beam 218 is directed from ion beam source 220 at a glancing angle with respect to the top surface of sample workpiece 222. As a result, feature 310 is milled to a greater depth than feature 304. Electron beam 250 is directed from electron beam source 252 at a nearly orthogonal angle with respect to the top surface of sample work piece 222 to form images of the cross sections of multiple adjacent features 302-310. Applicants have recognized the semiconductor fabrication process is typically sufficiently controlled so that the nearby structures that are designed to have the same shape are in fact essentially identical. Forming a three dimensional image by combining measurements at different depths of multiple, essentially identical features is much faster than milling a single feature multiple times measuring the single feature at different depths.

Figure 3A:
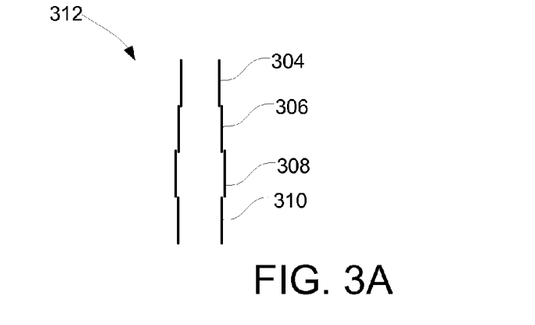
FIG. 3A shows a "virtual" hole 312 formed using the measurements from holes 304, 306, 308 and 310 and different depths.

Because multiple adjacent features 302-310 are substantially identical, and the cross section of multiple adjacent features 302-310 is made at varying depths along the features, the images of the cross sections of those features can be assembled by computer software to form a 3D model that approximates one of features. That is, the diameters of features 302, 304, 306, 308 and 310 are measured at the different depths exposed on the sloped surface. FIG. 3A shows a "virtual" hole 312 formed using the measurements from holes 304, 306, 308 and 310 and different depths. While virtual hole 312 is shown as an example formed from four measurements, the actual number of measurements from identical structures could be much greater. The vertical resolution will depend on the angle at which the beam 218 cuts the work piece and the distance between identical features. That is, at a more shallow angle, the difference in depth between measurements of adjacent structures will be smaller. If higher vertical resolution is required, the three-dimension reconstruction process from identical features can be combined with additional milling operations. For example, if measurements from identical structures exposed at different depths provide a measurement for every 50 nm of depth, after the initial measurement beam 218 can mill 25 nm from the sloped surface and another set of measurements can be performed, each measurement in the second set being from a depth different from the measurements in the first set. For example, measurements in the first set can be from depths 100 nm, 150 nm, 200 nm, etc. Measurements in the second set after milling can be from depths of 125 nm, 175 nm, 225 nm, etc. Combing the two sets of measurements provides a measurement at every 25 nm of vertical height, and the measurements can be combined into one virtual feature. The feature is not limited to a hole, but can be any feature that is repeated. The steps are essentially to mill the work piece at a shallow angle. Measure a dimension of substantially identical features that are exposed at different depths along the milled face. Then the measurements of the different features are combined to determine the dimensions are different depths of a single virtual feature. Optionally, additional mill steps are performed with additional measurements steps, to provide additional measurements at different depths to improve the vertical resolution of the measurements of the virtual feature.

Figure 4:
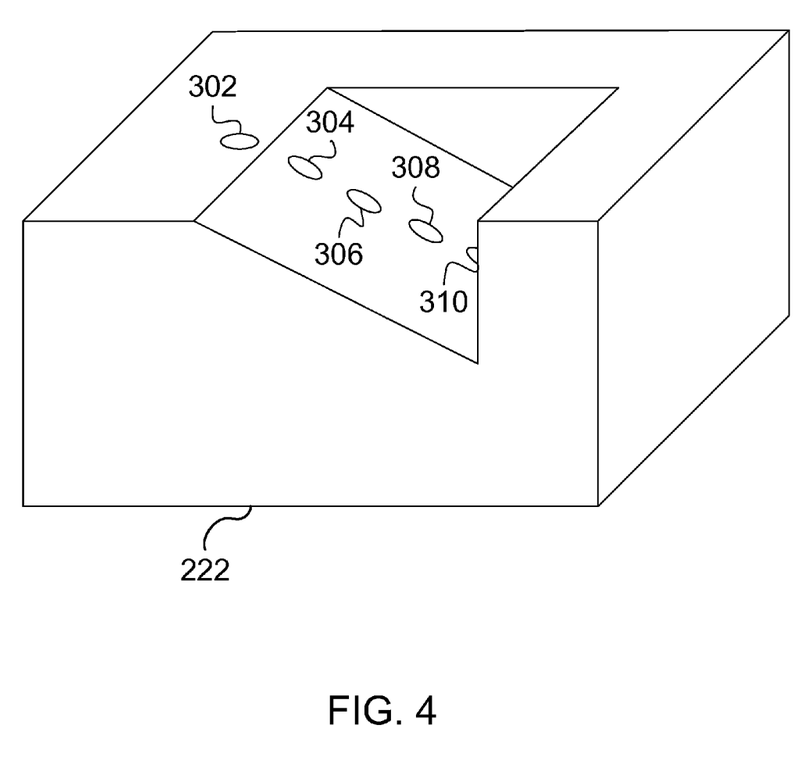
FIG. 4 shows a top view of sample workpiece 222 after performing a glancing angle milling operation with multiple adjacent features 302-310 that are substantially identical.

FIG. 4 shows a top view of sample workpiece 222 after performing a glancing angle milling operation with multiple adjacent features 302-310 that are substantially identical.

Depending upon the angle of the mill and the geometry and spacing of the multiple adjacent features, it may be necessary to perform several glancing angle mills at increasing depths to obtain enough cross sections to provide sufficient resolution for the 3D model. For example, if the angle of the mill is to steep, or the multiple adjacent features are too far apart in the horizontal direction, or both, then the cross sections of adjacent feature may be too far apart in the vertical direction. That is, the cross sections of adjacent features may not be close enough in depth and a gap may exist between the two in the vertical direction. A subsequent glancing angle milling operation can be performed to obtain a second set of cross section images at a greater depth.

In some semiconductor applications, the multiple adjacent features can have dimensions smaller than 10 nanometers (nm). As a result, the subsequent glancing angle milling operation may be only 1-2 nm deeper than the previous glancing angle milling operation. Accurate placement of the milling operation is critical to obtaining accurate cross sections and an accurate 3D model. However, because the FIB is directed at a glancing angle, accurate placement of the beam using images of the features of interest is difficult. Fiducials are typically used for locating features on a sample workpiece. However, typical fidicuals used for locating features on a sample workpiece are placed on the top surface of the sample workpiece for top-down beam imaging. Fiducials placed on the top surface of the sample workpiece have several drawbacks with glancing angle milling operations. Fiducials are typically placed the top surface of the sample workpiece. The glancing angle of the FIB makes it difficult to observe a fiducial on the top surface of the sample workpiece with the FIB for beam placement. Also, because the subsequent glancing angle milling operations may be only 1-2 nm deeper than the previous glancing angle milling operation, the fiducial on the top surface of the sample workpiece might be too far from the bottom of milled surface to provide a reference for accurate beam placement.

Figure 5:
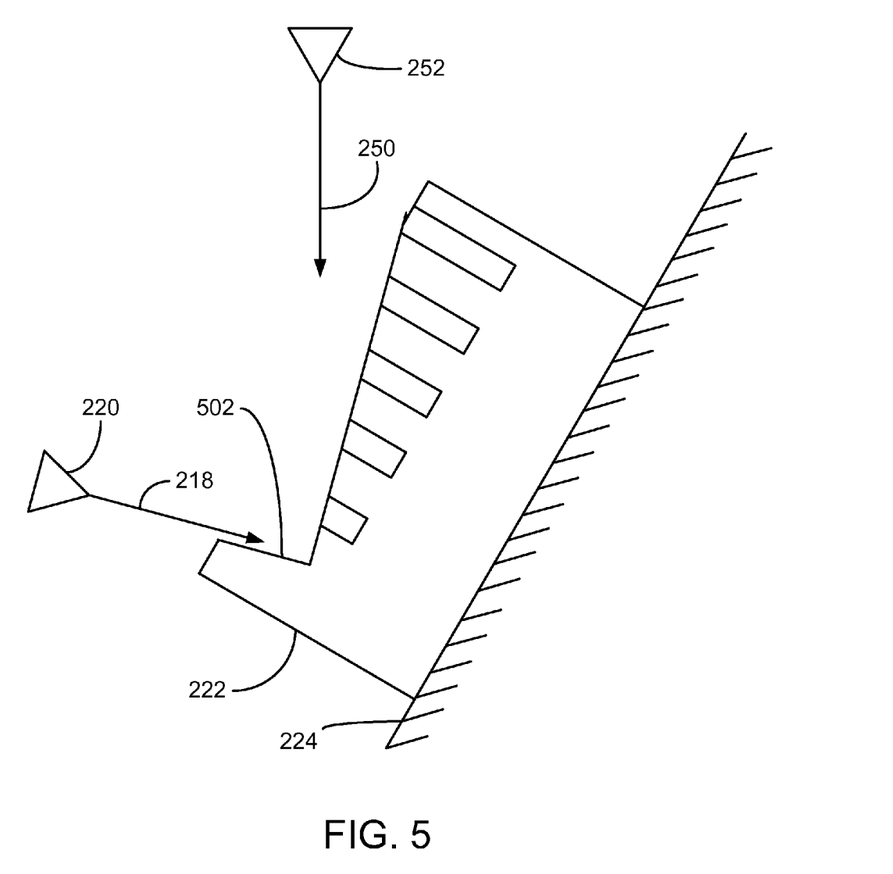
FIG. 5 shows a side view of sample workpiece 222 that has been oriented for milling a face 502 that will be as close to normal/perpendicular to the final milling orientation.

In accordance with embodiments of the present invention, a fiducial is produced at an orientation that is more normal to the final milling position to the FIB. To do this requires creating a milled face that will be as close to normal/perpendicular to the final milling orientation, then orienting the sample to the milling position and create the fiducial in the milled faced. FIG. 5 shows a side view of sample workpiece 222 that has been oriented for milling a face 502 that will be as close to normal/perpendicular to the final milling orientation. Sample workpiece 222 can be placed in this orientation by rotating the sample stage 180 degree and tilting the stage so that ion beam 218 is substantially perpendicular or normal to the ion beam incident angle when performing the glancing angle milling operation. Face 502 also is substantially perpendicular or normal to the ion beam incident angle when performing the glancing angle milling operation, enabling a higher quality fiducial for reference during beam imaging and patterning. A fiducial is then milled in face 502.

Alternatively, a three-dimensional fiducial can be formed on face 502. U.S. patent application Ser. No. 13/533,870, which is herein incorporated by reference in its entirety, discloses a three dimensional fiducial that extends to a detectable extent into three dimensions above a surface of a sample. The three dimensional ("3D") fiducial is a single reference point that can be recognized simultaneously from different angles. The 3D fiducial is built by depositing a block of material on a sample near an area of interest and then milling unique patterns into the top and sides. These patterns will have distinct brightness and contrast values relative to the background block material allowing for image recognition. The fiducial can be recognized from one or more beams as well as from various stage tilt and rotation positions. The 3D fiducial allows for FIB cut placement using image recognition on an almost vertical plane. For example, a fiducial mark can be cut into the top and side of a raised platinum pad allowing ion beam image recognition from this glancing angle.

Figure 6:
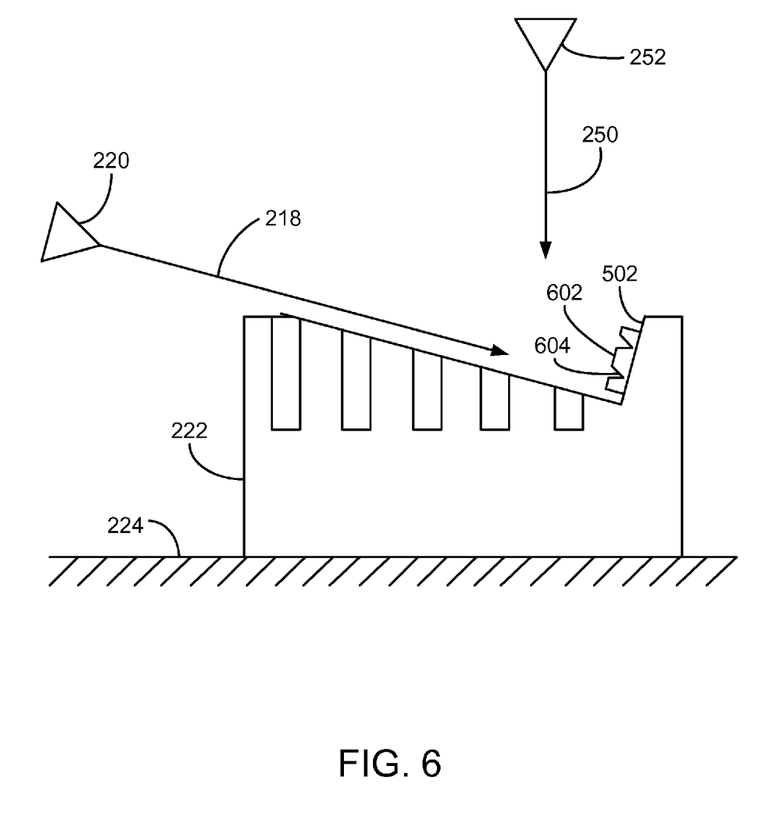
FIG. 6 shows a side view of sample workpiece 222 with a three dimensional fiducial 602 formed on face 502.

FIG. 6 shows a side view of sample workpiece 222 with a three dimensional fiducial 602 formed on face 502. 3D fiducial 602 is formed by depositing a material on face 502 using electron beam 250 or ion beam 218 and known deposition methods. 3D fiducial 602 may include one or more patterns 604 etched in the fiducial that improve the contrast and readability of fiducial 602. Ion beam 218 can be directed more precisely with fiducial 602 because fiducial 602 is substantially normal to the ion beam 218. Also, fiducial 602 and pattern 604 are closer to the surface that is being milled with the glancing angle mill operation and provide an improved point of reference over to top surface fiducial.

Figure 7:
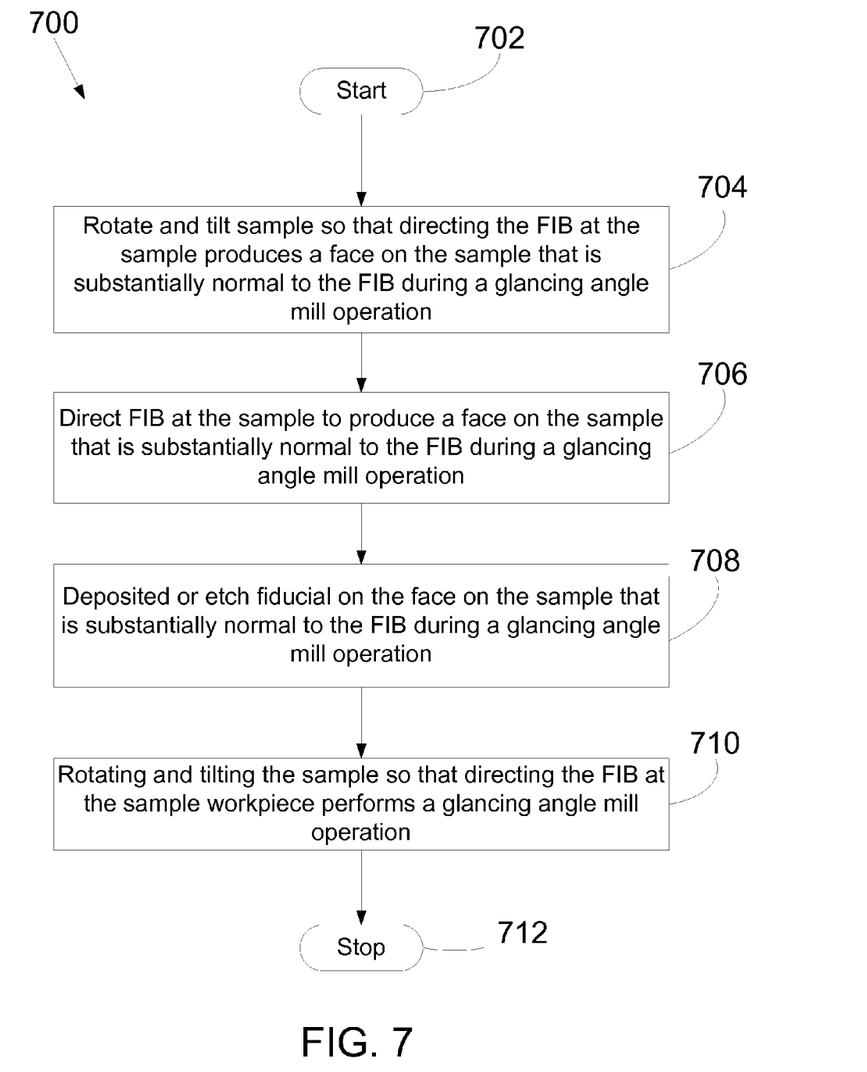
FIG. 7 is a flowchart 700 showing the steps of forming a fiducial suited for glancing angle milling in accordance with embodiments of the present invention.

FIG. 7 is a flowchart 700 showing the steps of forming a fiducial suited for glancing angle milling in accordance with embodiments of the present invention. The method begins at start block 702. At step 704, sample is rotated and tilted so that directing the FIB at the sample produces a face on the sample that is substantially normal to the FIB during a glancing angle mill operation. At step 706, the FIB is directed at the sample to produce a face on the sample that is substantially normal to the FIB during a glancing angle mill operation. At step 708, a fiducial is deposited or etched on the face on the sample that is substantially normal to the FIB during a glancing angle mill operation. A deposited fiducial may also be etched with a pattern to improve contrast/recognition. At step 710, sample is rotated and tilted so that directing the FIB at the sample workpiece performs a glancing angle mill operation.

Figure 8:
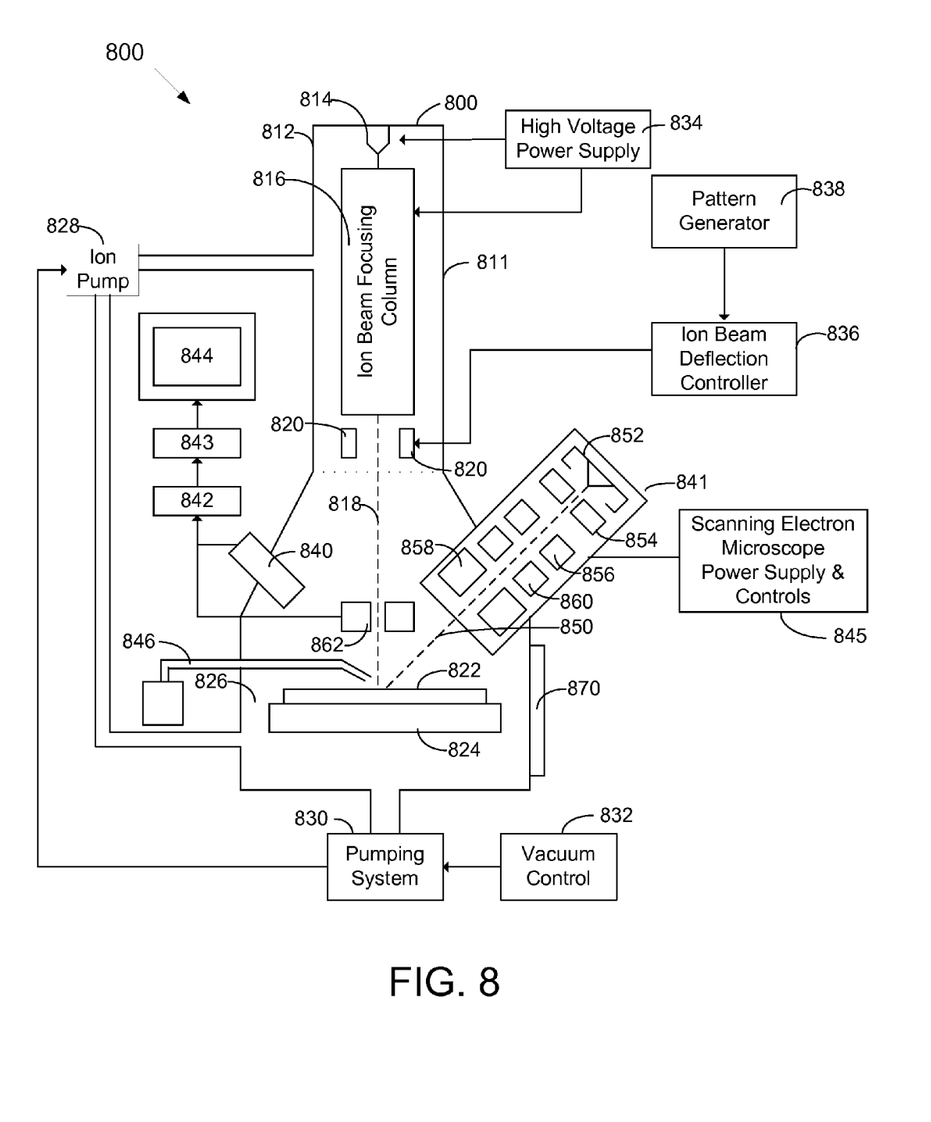
FIG. 8 shows a typical dual beam FIB/SEM system 800 suited for implementing one or more embodiments of the present invention.

FIG. 8 shows a typical dual beam FIB/SEM system 800 used to implement one or more embodiments of the present invention. Focused ion beam system 800 includes an evacuated envelope 811 having an upper neck portion 812 within which are located an ion source 814 and a focusing column 816 including extractor electrodes and an electrostatic optical system. Ion beam 818 passes from ion source 814 through column 816 and between electrostatic deflection means schematically indicated at 820 toward sample 822, which comprises, for example, a semiconductor device positioned on movable sample stage 824 within lower chamber 826. An ion pump 828 is employed for evacuating neck portion 812. The chamber 826 is evacuated with turbomolecular and mechanical pumping system 830 under the control of vacuum controller 832. The vacuum system provides within chamber 826 a vacuum of between approximately 1×10−7 Torr and 5×10−4 Torr. If an etch assisting gas, an etch retarding gas, or a deposition precursor gas is used, the chamber background pressure may rise, typically to about 1×10−5 Torr.

High voltage power supply 834 is connected to ion source 814 as well as to appropriate electrodes in focusing column 816 for forming an ion beam 818 and directing the same downwardly. Deflection controller and amplifier 836, operated in accordance with a prescribed pattern provided by pattern generator 838, is coupled to deflection plates 820 whereby beam 818 may be controlled to trace out a corresponding pattern on the upper surface of sample 822. In some systems the deflection plates are placed before the final lens, as is well known in the art.

The ion source 814 typically provides a metal ion beam of gallium, although other ion sources, such as a multicusp or other plasma ion source, can be used. The ion source 814 typically is capable of being focused into a sub one-tenth micron wide beam at sample 822 for either modifying the sample 822 by ion milling, enhanced etch, material deposition, or for the purpose of imaging the sample 822. A charged particle multiplier 840 used for detecting secondary ion or electron emission for imaging is connected to amplifier 842. The amplified signals are converted into digital signals and subjected to signal processing by the signal processor unit 843. The resulting digital signal is to display an image of workpiece 822 on the monitor 844.

A scanning electron microscope 841, along with power supply and control unit 845, is also provided with the FIB system 800. An electron beam 850 is emitted from a cathode 852 by applying voltage between cathode 852 and an anode 854. Electron beam 850 is focused to a fine spot by means of a condensing lens 856 and an objective lens 858. Electron beam 850 is scanned two-dimensionally on the specimen by means of a deflection coil 860. Operation of condensing lens 856, objective lens 858, and deflection coil 860 is controlled by power supply and control unit 845.

Electron beam 850 can be focused onto workpiece 822, which is on sample stage 824 within lower chamber 826. When the electrons in the electron beam strike workpiece 822, secondary electrons are emitted. These secondary electrons are detected by secondary electron detector 840 or by backscattered electron detector 862, which are connected to an amplifier 842. The amplified signals are converted into digital signals and subjected to signal processing by the signal processor unit 843. The resulting digital signal is to display an image of workpiece 822 on the monitor 844.

A gas delivery system 846 extends into lower chamber 826 for introducing and directing a gaseous vapor toward sample 822. U.S. Pat. No. 5,851,413 to Casella et al. for "Gas Delivery Systems for Particle Beam Processing," assigned to the assignee of the present invention, describes a suitable fluid delivery system 246. Another gas delivery system is described in U.S. Pat. No. 5,435,850 to Rasmussen for a "Gas Injection System," also assigned to the assignee of the present invention.

A door 870 is opened for inserting sample 822 onto sample stage 824, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 816 for energizing and focusing ion beam 818. Dual beam FIB/SEM systems are commercially available, for example, from FEI Company, Hillsboro, Oreg., the assignee of the present application.

Figure 9:
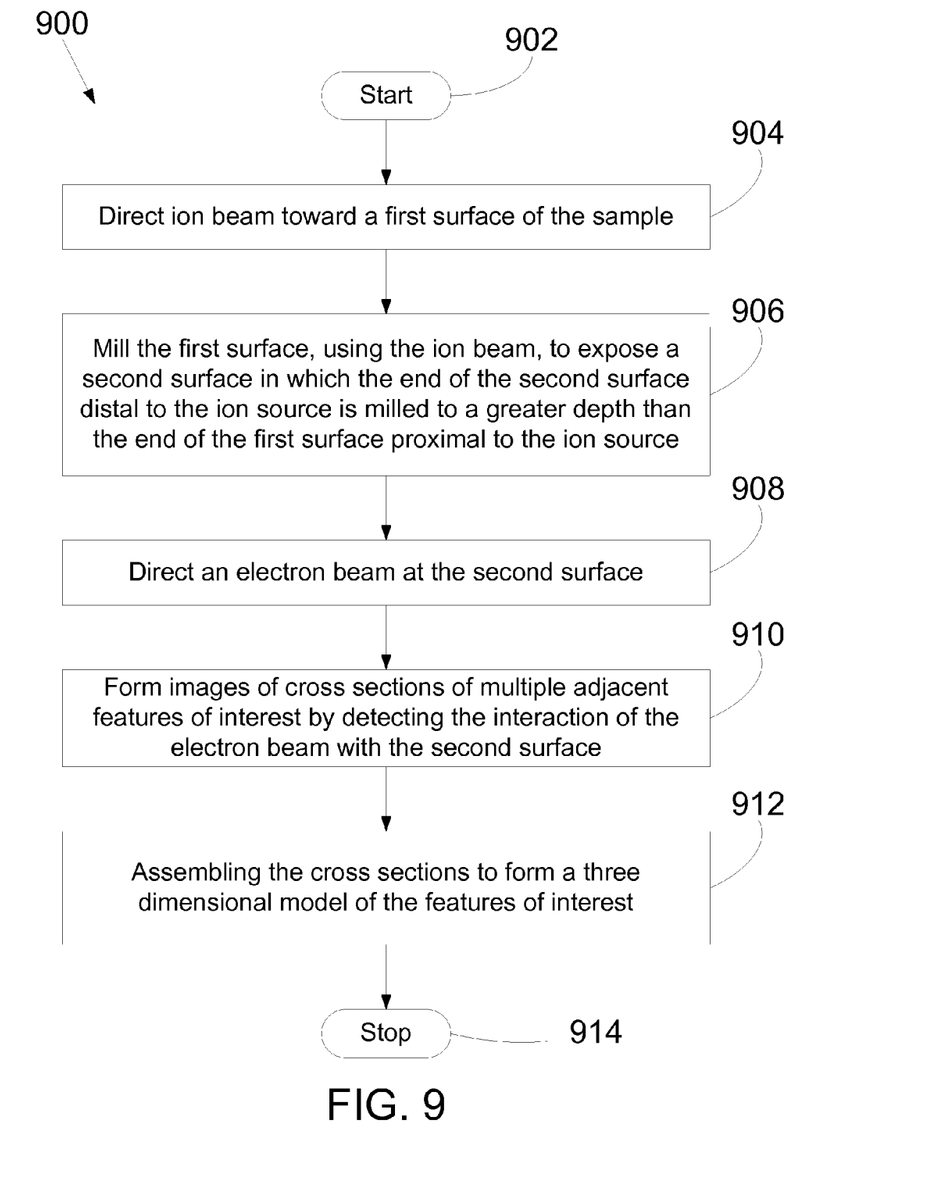
FIG. 9 is a flowchart 900 showing the steps of performing a sample analysis according one or more embodiments of the present invention.

FIG. 9 is a flowchart 900 showing the steps of performing a sample analysis according one or more embodiments of the present invention. The process begins at terminator 902. At step 904, ion beam 218 is directed at a first surface of sample 222 to mill at least a portion of sample 222. Fiducial 602 is used as a reference for ion beam placement. In a preferred embodiment, the first surface is the top surface of sample 222 and ion beam is 218 is directed at a glancing angle near an edge of the top surface instead of being directed at a nearly perpendicular angle to the top surface. At step 906, ion beam 218 mills the first surface to expose a second surface in sample 222 in which the end of the second surface distal to ion source 214 is milled to a greater depth relative to a reference depth than the end of the first surface proximal to ion source 814. That is, along the length of the exposed second surface, the end of the second surface farther from the beam source is milled to a greater depth than the end of the second surface closest to the beam source. The difference in depth is due to the angle of the beam with respect to the first surface. Because the angle is a glancing angle, the difference in depth along the entire second surface can be made to be only as deep at the feature that is to be analyzed based. At step 908, electron beam 250 from SEM 841 is directed to the second surface for forming an image of the second surface. At step 910, images are formed of the cross sections of the multiple adjacent features of interest by detecting the interaction of the electron beam with the second surface. For example, secondary electron detector 240 or backscattered electron detector 862 can be used to form the images from the secondary electrons that are emitted when electron beam 250 is directed at the second surface of sample 222. At step 912, the images formed in step 910 are assembled to form a three dimensional model of the features of interest.

When removing material using a FIB at an angle it is useful to target a depth at a giving position. Using an offset from a position on the surface, material can be removed to a targeted depth based on the angle of the mill. That is, with a known angle of a resulting mill angle with a focused ion beam the position of depth of the exposed face can be calculated as a function of position by its offset from the surface marker/fiducial. Using the calculation, the FIB can be positioned so as to have it cross a given point at a targeted depth when milling at an angle.

Figure 10:
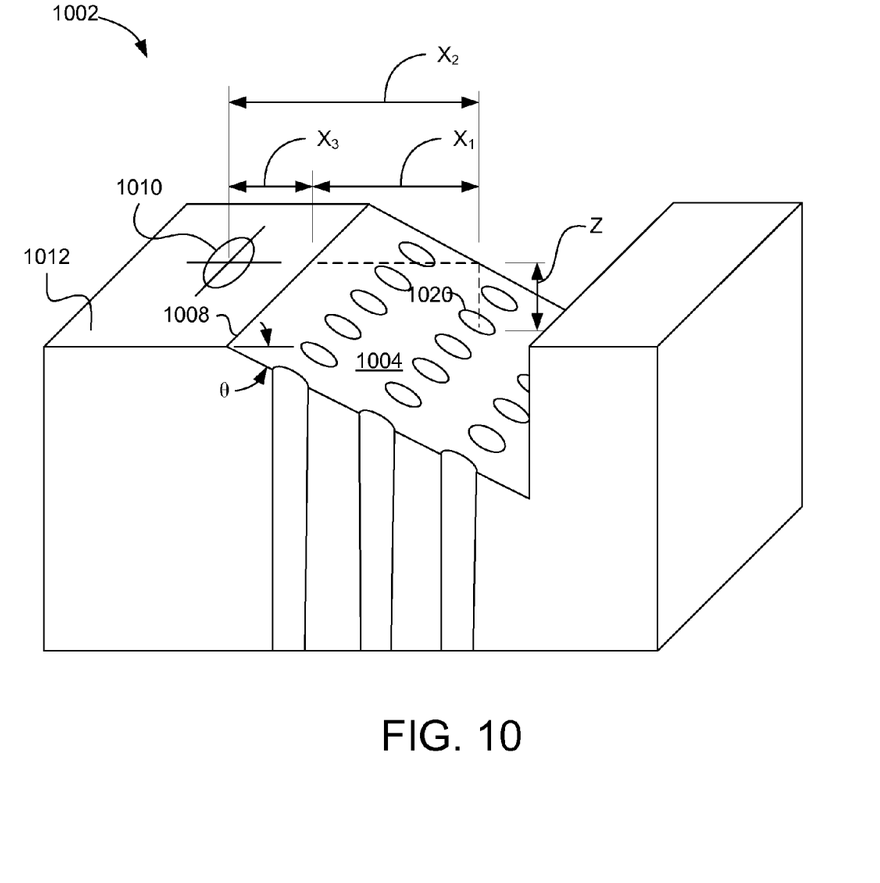
FIG. 10 shows a work having a three-dimensional nanoscale structure.

FIG. 10 shows a portion of a portion of a 3D integrated circuit 1002 in which a sloped surface 1004 was cut into a top surface 1012 of a work piece. The angle θ at which the surface 1004 is cut by the focused ion beam is precisely known. The depth of a feature 1020 can then be determined accurately using the horizontal distance $X_1$ from the beginning of the slope. From trigonometry, the depth Z is equal to the tangent of θ times $X_1$. $X_1$ can be difficult to determine, as a line 108 indicting the beginning of the slope may be difficult to locate precisely because of the small angle between surface 1004 and surface 1012. Rather than using line 1008 as a reference feature, a reference feature such as a fiducial mark 1010 can be milled in the top surface and used to determine $X_2$, which can then be used to determine $X_1$, from the known distance between the fiducial mark and the line 1008. An existing feature could also be found near the feature or interest and used as a reference. The reference feature is preferably sufficiently close to the feature of interest that an electron beam or ion beam can image both the feature of interest and the reference feature without moving the stage. By "horizontal distance" is meant the distance, in the plane of top surface 1012 and in a direction normal to line 1008, to a point corresponding to the projection normal to the top surface plane of the feature onto the top surface plane.

Figure 11:
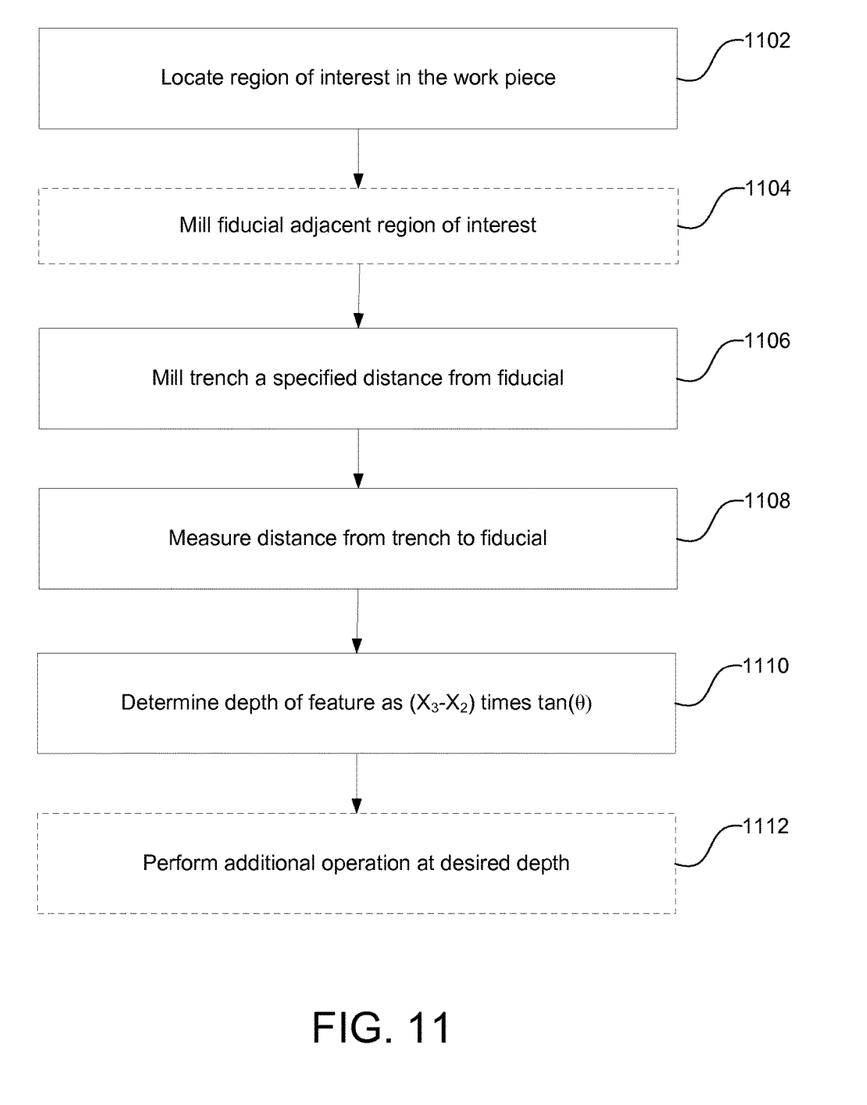
FIG. 11 is a flow chart showing another embodiment of the present invention.

FIG. 11 describes a method of exposing a structure and determining the depth below the surface of the exposed structure. In step 1102, a region of interest is located on a work piece. The region of interest can be located, for example, using computer-aided design (CAD) data to provide the coordinates of the region in a wafer coordinate system. In optional step 1104, a fiducial mark is milled adjacent to the region of interest. In step, 1106, a shallow trench is milled, preferably with a focused ion beam, to expose buried features. The trench is preferably milled at a specified distance from the fiducial or other reference feature. In some embodiments, the trench position may be determined solely using wafer coordinates, without the use of a local reference mark, although the use of a local reference mark increases accuracy.

After the trench is milled in step 1106, the position, $X_3$, of the trench relative to the fiducial is confirmed by measuring the distance $X_3$ between the beginning of the trench and the fiducial in step 1108. This can be performed, for example, by observing the fiducial and the beginning of the trench top down using an SEM, or the sample can be tilted to provide a different an angled view of the trench. If a feature 1020 is observed on the sloped surface, the depth of that feature can be accurately determined in step 1110 by measuring the distance parallel to the Y-axis in the X-Y plane from the fiducial mark to the feature. As described above, the depth of the feature can then be calculated as tangent of θ times $X_1$, with $X_1$ equal to $X_2$, the distance from the fiducial to the feature, minus the distance between the fiducial and the edge 1008. In step 1112, additional processing can be performed at a known depth using the depth determination in step 1110.

Embodiments of the present invention can be used to indicate the depth in order to perform additional milling or other processing at a desired depth. That is, the horizontal distance from the fiducial can be used to either determine the depth of an exposed feature, or can be used to determine the depth at which to perform additional processing.

Embodiments of the present invention are directed to a method for analyzing a sample with a charged particle beam. The method comprises directing a charged particle beam toward a first surface of a sample; milling the first surface to expose a second surface in the sample in which the end of the second surface distal to ion source is milled to a greater depth relative to a reference depth than the end of the first surface proximal to ion source; directing the charged particle beam toward the second surface to form one or more images of the second surface; forming images of the cross sections of the multiple adjacent features of interest by detecting the interaction of the electron beam with the second surface; and assembling the images of the cross section into a three-dimensional model of one or more of the features of interest. The milling can be performed by an ion beam. The images can be formed with an electron beam.

The method can include milling the second surface to expose a third surface, the third surface being deeper within the sample than the second surface; directing the charged particle beam toward the third surface to form one or more images of the third surface; forming images of the cross sections of the multiple adjacent features of interest by detecting the interaction of the electron beam with the third surface. The images formed from the second surface and the images formed from the third surface can be assumed to form a three-dimensional model of one or more of the features of interest.

Embodiments of the present invention are also directed to a method for forming a fiducial on a sample, the method comprising positioning a sample so that a charged particle beam is directed at the sample for a first milling operation, the charged particle beam being directed at a first angle that is substantially orthogonal to a second angle; directing a charged particle beam at the sample to mill a face on the sample that is substantially parallel to the charged particle beam; milling a face on the sample that is substantially parallel to the charged particle beam; forming a fiducial on the milled face of the sample; and positioning the sample so that the charged particle beam is directed at the sample for a second milling operation, the charged particle beam being directed at the second angle, the second angle being no greater than ten degrees with respect to the sample surface.

In some embodiments, the second angle is no greater than 5 degrees with respect to the sample surface. In other embodiments the second angle is no greater than 1 degree with respect to the sample surface.

Embodiments of the present invention are also directed to a method of analyzing a three-dimensional microscopic structure, the method comprising locating a region of interest on work piece; cutting a trench at a specified angle in the work piece, the trench exposing a feature of interest; determining the horizontal distance between the edge of the trench and the feature of interest; and determining from the specified angle and the horizontal distance, the depth of the feature of interest below the plane of the work piece surface. The method can include determining the horizontal distance between the edge of the trench and the feature of interest comprises determining the horizontal distance between a reference mark and the feature of interest and determining the horizontal distance between the reference mark the edge of the trench. The method can include milling a reference mark using a focused ion beam adjacent the region of interest. In some embodiments, the reference mark is a preexisting feature on the work piece. The method can include processing the work piece at a specified depth determined from the horizontal distances.

Embodiments of the present invention are also directed to systems for performing any of the methods described herein, the system comprising a focused ion beam system, an electron microscope, and a sample stage for supporting a sample.

Preferred embodiments of the present invention also make use of a particle beam apparatus, such as a FIB or SEM, in order to image a sample using a beam of particles. Such particles used to image a sample inherently interact with the sample resulting in some degree of physical transformation. Further, throughout the present specification, discussions utilizing terms such as "analyzing", "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application.

Although much of the previous description is directed at semiconductor wafers, the invention could be applied to any suitable substrate or surface. Further, whenever the terms "automatic," "automated," or similar terms are used herein, those terms will be understood to include manual initiation of the automatic or automated process or step. In the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor chip" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of analyzing a three-dimensional microscopic structure, the method comprising:
   locating a region of interest on a work piece;
   cutting a trench at a specified angle in the work piece, the trench exposing a feature of interest in the work piece, wherein the feature of interest is present in the work piece before cutting the trench;
   determining the horizontal distance between the edge of the trench and the feature of interest;
   calculating the depth of the feature of interest below the plane of the work piece surface using the specified angle at which the trench is cut and the horizontal distance between the edge of the trench and the feature of interest.

2. The method of claim 1 in which determining the horizontal distance between the edge of the trench and the feature of interest comprises determining the horizontal distance between a reference mark and the feature of interest and determining the horizontal distance between the reference mark and the edge of the trench.

3. The method of claim 2 further comprising milling a reference mark using a focused ion beam adjacent the region of interest.

4. The method of claim 2 in which the reference mark is a preexisting feature on the work piece.

5. The method of claim 1 further comprising processing the work piece at a specified depth determined from the horizontal distance.

6. The method of claim 1, in which the specified angle at which the trench is cut in the work piece is no greater than ten degrees with respect to the plane of the work piece surface.

7. The method of claim 1, in which the specified angle at which the trench is cut in the work piece is no greater than five degrees with respect to the plane of the work piece surface.

8. The method of claim 1, in which the specified angle at which the trench is cut in the work piece is no greater than one degree with respect to the plane of the work piece surface.

* * * * *